(12) United States Patent
Imamura

(10) Patent No.: US 11,488,827 B2
(45) Date of Patent: Nov. 1, 2022

(54) LASER IRRADIATION APPARATUS WITH POLARIZING PLATE

(71) Applicant: JSW AKTINA SYSTEM CO., LTD., Yokohama (JP)

(72) Inventor: Hiroaki Imamura, Tokyo (JP)

(73) Assignee: JSW AKTINA SYSTEM CO., LTD., Yokohama (JP)

(*) Notice: Subject to any disclaimer, the term of this patent is extended or adjusted under 35 U.S.C. 154(b) by 116 days.

(21) Appl. No.: 16/858,695

(22) Filed: Apr. 26, 2020

(65) Prior Publication Data
US 2021/0020443 A1 Jan. 21, 2021

(30) Foreign Application Priority Data
Jul. 18, 2019 (JP) .............................. JP2019-132594

(51) Int. Cl.
| | |
|---|---|
| *H01L 21/268* | (2006.01) |
| *H01L 21/677* | (2006.01) |
| *H01L 21/02* | (2006.01) |
| *G01N 21/17* | (2006.01) |
| *G01N 21/01* | (2006.01) |
| *B23K 26/03* | (2006.01) |
| *B23K 26/70* | (2014.01) |

(52) U.S. Cl.
CPC .......... *H01L 21/268* (2013.01); *B23K 26/032* (2013.01); *B23K 26/705* (2015.10); *G01N 21/01* (2013.01); *G01N 21/17* (2013.01); *H01L 21/02675* (2013.01); *H01L 21/677* (2013.01); *G01N 2021/0106* (2013.01)

(58) Field of Classification Search
CPC ......................... H01L 21/268; H01L 21/02675
USPC ............................... 356/364; 438/14, 16, 486
See application file for complete search history.

(56) References Cited

U.S. PATENT DOCUMENTS

| | | | |
|---|---|---|---|
| 5,817,548 A * | 10/1998 | Noguchi | ........... H01L 21/02532 257/E21.414 |
| 2009/0004763 A1* | 1/2009 | Ono | ....................... G01B 11/06 257/E21.001 |
| 2019/0267240 A1 | 8/2019 | Ohmori et al. | |

FOREIGN PATENT DOCUMENTS

JP 2018-037646 A 3/2018

\* cited by examiner

*Primary Examiner* — Quoc D Hoang
(74) *Attorney, Agent, or Firm* — SGPatents PLLC

(57) ABSTRACT

A laser irradiation apparatus includes: a laser generation apparatus configured to generate first laser light for performing heat treatment of an object to be processed; a measurement-laser emission unit configured to emit linearly-polarized second laser light toward an irradiation area on the object to be processed to which the first laser light is applied; a first polarizing plate configured to let, of the whole reflected light of the second laser light reflected by the object to be processed, a part of the reflected light that has a first polarization direction pass therethrough; and a measurement-laser detection unit configured to detect the reflected light that has passed through the first polarizing plate.

7 Claims, 11 Drawing Sheets

LASER IRRADIATION APPARATUS WITH POLARIZING PLATE

INCORPORATION BY REFERENCE

This application is based upon and claims the benefit of priority from Japanese patent application No. 2019-132594, filed on Jul. 18, 2019, the disclosure of which is incorporated herein in its entirety by reference.

BACKGROUND

The present disclosure relates to a laser irradiation apparatus, a laser irradiation method, and a method for manufacturing a semiconductor device.

A laser annealing apparatus (a laser irradiation apparatus) that irradiates an amorphous film formed over a silicon substrate, a glass substrate, or the like with laser light, and thereby forms a crystallized film by crystallizing the amorphous film has been known. For example, Japanese Unexamined Patent Application Publication No. 2018-37646 discloses a technique related to such a laser irradiation apparatus.

SUMMARY

In such a laser irradiation apparatus, it is desirable to perform a high-quality annealing process for an amorphous film.

Other problems to be solved and novel features will become apparent from descriptions in this specification and accompanying drawings.

A first exemplary aspect is a laser irradiation apparatus including: a laser generation apparatus configured to generate first laser light for performing heat treatment of an object to be processed; a measurement-laser emission unit configured to emit linearly-polarized second laser light toward an irradiation area on the object to be processed to which the first laser light is applied; a first polarizing plate configured to let, of the whole reflected light of the second laser light reflected by the object to be processed, a part of the reflected light that has a first polarization direction pass therethrough; and a measurement-laser detection unit configured to detect the reflected light that has passed through the first polarizing plate.

Another exemplary aspect is a laser irradiation method including the steps of: generating first laser light for performing heat treatment of an object to be processed; emitting linearly-polarized second laser light toward an irradiation area on the object to be processed to which the first laser light is applied; making, of the whole reflected light of the second laser light reflected by the object to be processed, a part of the reflected light that has a first polarization direction pass through a first polarizing plate; and detecting the reflected light that has passed through the first polarizing plate.

According to the above-described aspect, it is possible to provide a laser irradiation apparatus, a laser irradiation method, and a method for manufacturing a semiconductor device, capable of performing a high-quality annealing process.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

A laser irradiation apparatus, a laser irradiation method, and a method for manufacturing a semiconductor device according to this embodiment will be described hereinafter with reference to the drawings. Note that the following description is given on the assumption that an object to be processed to which laser light is applied is a glass substrate having a bottom-gate structure in which a metal gate electrode and an amorphous silicon film are laminated. However, the object to be processed is not limited to any particular object as long as it has a bottom-gate structure.

An example of the laser irradiation apparatus is an excimer-laser annealing apparatus that applies laser light to an amorphous silicon film formed over a substrate and thereby forms a polysilicon film over the substrate. Therefore, the laser irradiation apparatus is used to manufacture a TFT (Thin Film Transistor) array substrate in a manufacturing process for a liquid-crystal display panel or an organic EL (Electro Luminescence) display panel. That is, the laser irradiation apparatus is used in a manufacturing process for a semiconductor device such as a TFT array substrate.

First Embodiment

Basic Configuration of Irradiation Apparatus

Figure 1:
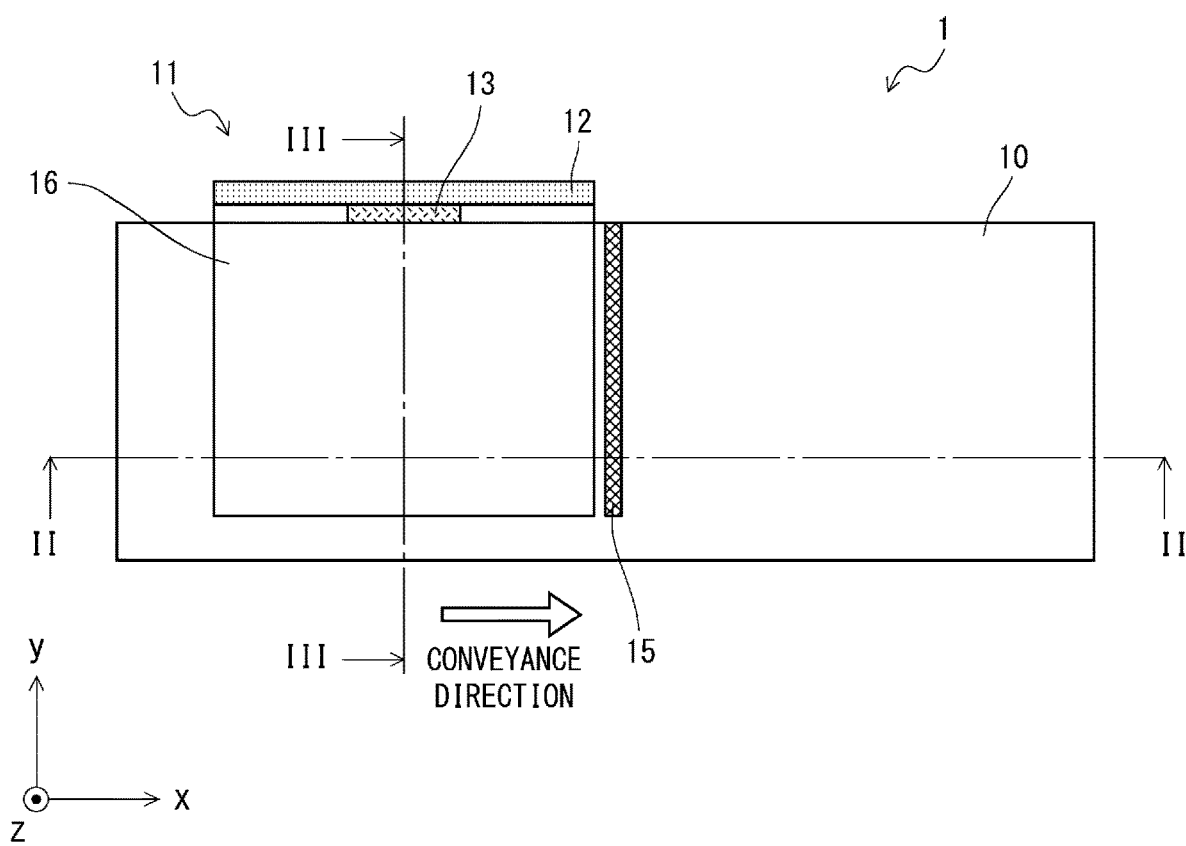
FIG. 1 is a plan view schematically showing a basic configuration of a laser irradiation apparatus.
Figure 2:
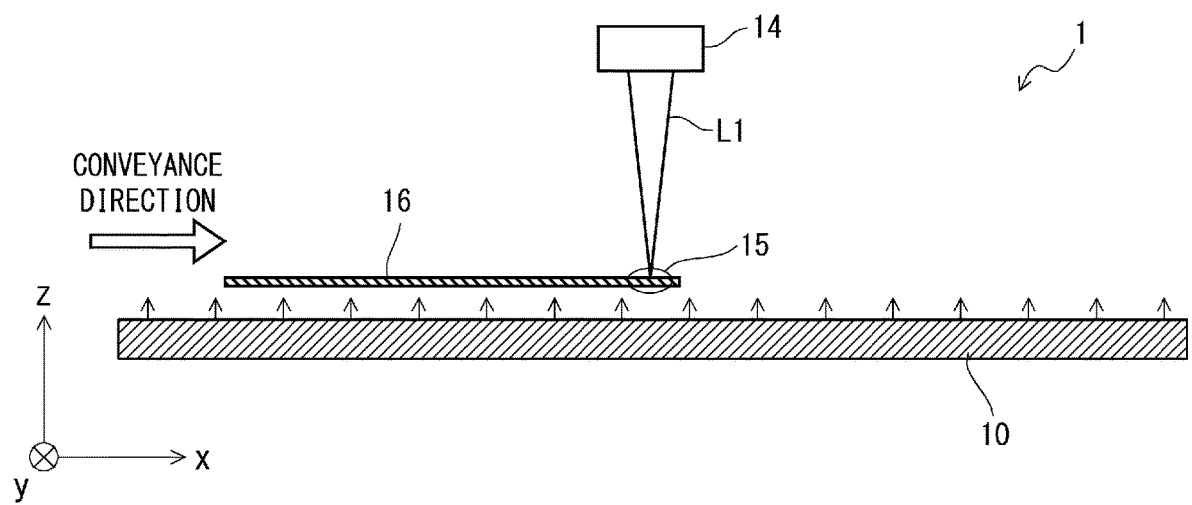
FIG. 2 is a cross-sectional view taken along a line II-II indicated in FIG. 1.
Figure 3:
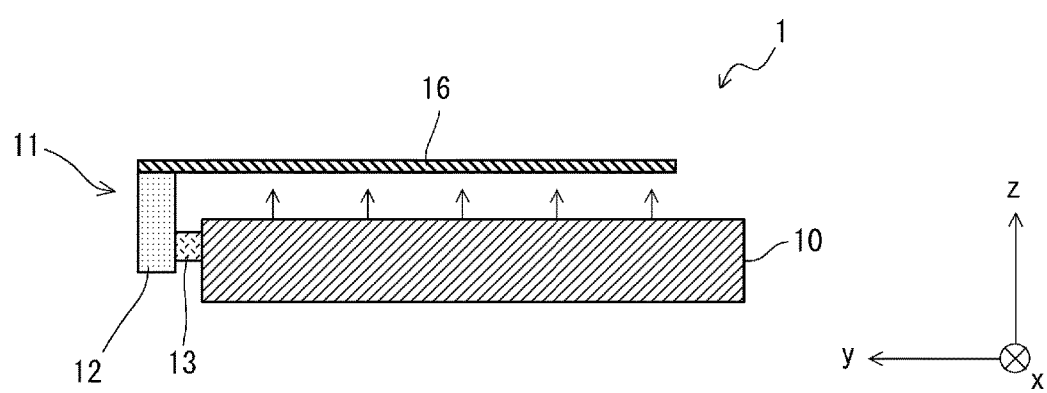
FIG. 3 is a cross-sectional view taken along a line indicated in FIG. 1.

Firstly, a basic configuration of the laser irradiation apparatus is described with reference to FIGS. 1 to 3. FIG. 1 is a plan view schematically showing a basic configuration of a laser irradiation apparatus 1. FIG. 2 is a cross-sectional view taken along a line II-II indicated in FIG. 1. FIG. 3 is a cross-sectional view taken along a line indicated in FIG. 1.

Note that right-handed xyz-three-dimensional orthogonal coordinate systems shown in the below-described drawings, which correspond to each other throughout the drawings, are shown for the sake of explaining the positional relations among the components. In general, an xy-plane constitutes a horizontal plane and the positive direction in the z-axis direction is the vertically upward direction. The y-axis direction is a direction along a linear laser spot, and the x-axis positive direction is a conveyance direction. Linear laser light along the y-axis direction is applied to a substrate while it is being conveyed (i.e., being scanned) in the x-axis positive direction. Further, the x- and y-axis directions are directions along edges of a rectangular object to be processed 16.

As shown in FIGS. 1 to 3, the laser irradiation apparatus 1 includes, as its basic configuration, a floatation unit 10, a conveyance unit 11, and a laser generation device 14. As shown in FIG. 2, the floatation unit 10 is configured to eject a gas from its surface, and the object to be processed 16 is floated as the gas ejected from the surface of the floatation unit 10 is blown to the bottom surface of the object to be processed 16. For example, the object to be processed 16 is a glass substrate. When the object to be processed 16 is conveyed, the floatation unit 10 adjusts a floatation height so that the object to be processed 16 does not come into contact with other mechanisms (not shown) disposed above the object to be processed 16.

The conveyance unit 11 conveys the floated object to be processed 16 in the conveyance direction (the x-axis direction). As shown in FIG. 1 and FIG. 3, the conveyance unit 11 includes a holding mechanism 12 and a moving mechanism 13. The holding mechanism 12 holds the object to be processed 16. For example, the holding mechanism 12 can be constructed by using a vacuum adsorption mechanism including a porous element. The holding mechanism 12 is connected to an exhaust port (not shown) and the exhaust port is connected to an ejector, a vacuum pump, or the like. Therefore, since a negative pressure for sucking a gas acts on the holding mechanism 12, the object to be processed 16 can be held by using the holding mechanism 12.

Further, the holding mechanism 12 includes a raising/descending mechanism for performing an adsorption operation. The raising/descending mechanism includes, for example, an air cylinder or an actuator such as a motor. For example, the holding mechanism 12 adsorbs the object to be processed 16 in a state where the holding mechanism 12 is raised to an adsorbing position. Further, the holding mechanism 12 descends to a standby position in a state where the adsorption is cancelled.

As shown in FIG. 3, the holding mechanism 12 holds the object to be processed 16 by sucking the surface (the bottom surface) of the object to be processed 16 opposite to the surface (the top surface) thereof to which laser light is applied, i.e., by sucking the surface of the object to be processed 16 that is opposed to the floatation unit 10. Further, the holding mechanism 12 holds an end part of the object to be processed 16 in the y-axis positive direction (i.e., an end part in a direction perpendicular to the conveyance direction of the object to be processed 16).

The moving mechanism 13 included in the conveyance unit 11 is connected to the holding mechanism 12. The moving mechanism 13 is configured so that it can move the holding mechanism 12 in the conveyance direction (the x-axis direction). The conveyance unit 11 (the holding mechanism 12 and the moving mechanism 13) is disposed at an end part of the floatation unit 10 on the y-axis direction positive side. Further, the object to be processed 16 is conveyed as the moving mechanism 13 moves in the conveyance direction while the holding mechanism 12 is holding the object to be processed 16.

As shown in FIG. 1, for example, the moving mechanism 13 is configured to slide the end part of the floatation unit 10 in the y-axis positive direction along the x-axis positive direction. Therefore, the object to be processed 16 is conveyed along the x-axis direction as the moving mechanism 13 slides the end part of the floatation unit 10 along the x-axis positive direction. Note that the conveyance speed of the object to be processed 16 can be controlled by controlling the moving speed of the moving mechanism 13. The moving mechanism 13 includes, for example, an actuator such as a motor, a liner guide mechanism, an air bearing, etc. (not shown).

As shown in FIGS. 1 and 2, laser light L1 is applied to the object to be processed 16. For example, the laser irradiation apparatus is a laser annealing apparatus. In this case, an excimer laser or the like can be used for the laser generation device 14. Laser light emitted from the laser generation device 14 becomes linear in an optical system including a cylindrical lens (not shown). As shown in FIG. 1, the object to be processed 16 is irradiated with the linear laser light L1, specifically, laser light L1 having a focal point extending in the y-axis direction. In other words, the irradiation place (the irradiation area) 15 of the laser light L1 over the object to be processed 16 extends in a direction perpendicular to the conveyance direction (the x-axis direction) of the object to be processed 16 (i.e., extends in the y-axis direction).

The object to be processed 16 is, for example, a glass substrate in which an amorphous film is formed. The amorphous film can be crystallized by irradiating the amorphous film with laser light L1 and performing an annealing process. For example, the amorphous silicon film can be converted into a polycrystalline silicon film (a polysilicon film).

The laser irradiation apparatus shown in FIGS. 1 to 3 conveys the object to be processed 16 in the conveyance direction by holding the bottom surface of the object to be processed 16 using the conveyance unit 11 and while floating the object to be processed 16 using the floatation unit 10. Note that when the object to be processed 16 is conveyed, the conveyance unit 11 conveys the object to be processed 16 while the conveyance unit 11 is holding a part of the object to be processed 16 that does not overlap the laser irradiation place 15 in a plan view (i.e., as viewed from the z-axis direction positive side). That is, as shown in FIG. 1, when the object to be processed 16 is conveyed in the conveyance direction, the part of the object to be processed 16 at which the conveyance unit 11 holds the object to be processed 16 (i.e., the position of the holding mechanism 12) does not overlap the laser irradiation place 15.

For example, a planar shape of the object to be processed 16 is a rectangular shape (an oblong rectangular shape) and the conveyance unit 11 (the holding mechanism 12) holds only one of the four sides of the object to be processed 16. Further, the conveyance unit 11 (the holding mechanism 12) holds a part of the object to be processed 16 that is not irradiated with laser light in a period during which the object to be processed 16 is being conveyed.

By the above-described configuration, it is possible to position the part of the object to be processed 16 at which the conveyance unit 11 holds the object to be processed 16 (which corresponds to the position of the holding mechanism 12) and the laser irradiation place 15 away from each other. Therefore, it is possible to reduce the effect of the warping of the object to be processed 16 that occurs when laser light is applied to the object to be processed 16.

Next, a measurement apparatus 20 provided in the laser irradiation apparatus 1 will be described. The laser irradiation apparatus 1 further includes the measurement apparatus 20 in addition to the basic configuration shown in FIG. 1 and the like. The measurement apparatus 20 observes a melting and solidification state of a silicon film at a laser irradiation place 15 on an object to be processed 16, which is caused by application of laser light L1, by applying measurement laser light L2 to the laser irradiation place 15, and detecting and measuring its reflected light. The laser irradiation apparatus 1 can perform a high-quality annealing process for an amorphous silicon film by, for example, adjusting irradiation intensity and irradiation time of the laser light L1 based on a result of the measurement made by the measurement apparatus 20. In this way, it is possible to, for example, form a homogeneous crystal film.

Measurement Apparatus 20x at Conceptual Stage

Prior to describing the measurement apparatus 20 provided in the laser irradiation apparatus 1, technical matters that the inventors have examined in advance will be described.

Figure 4:
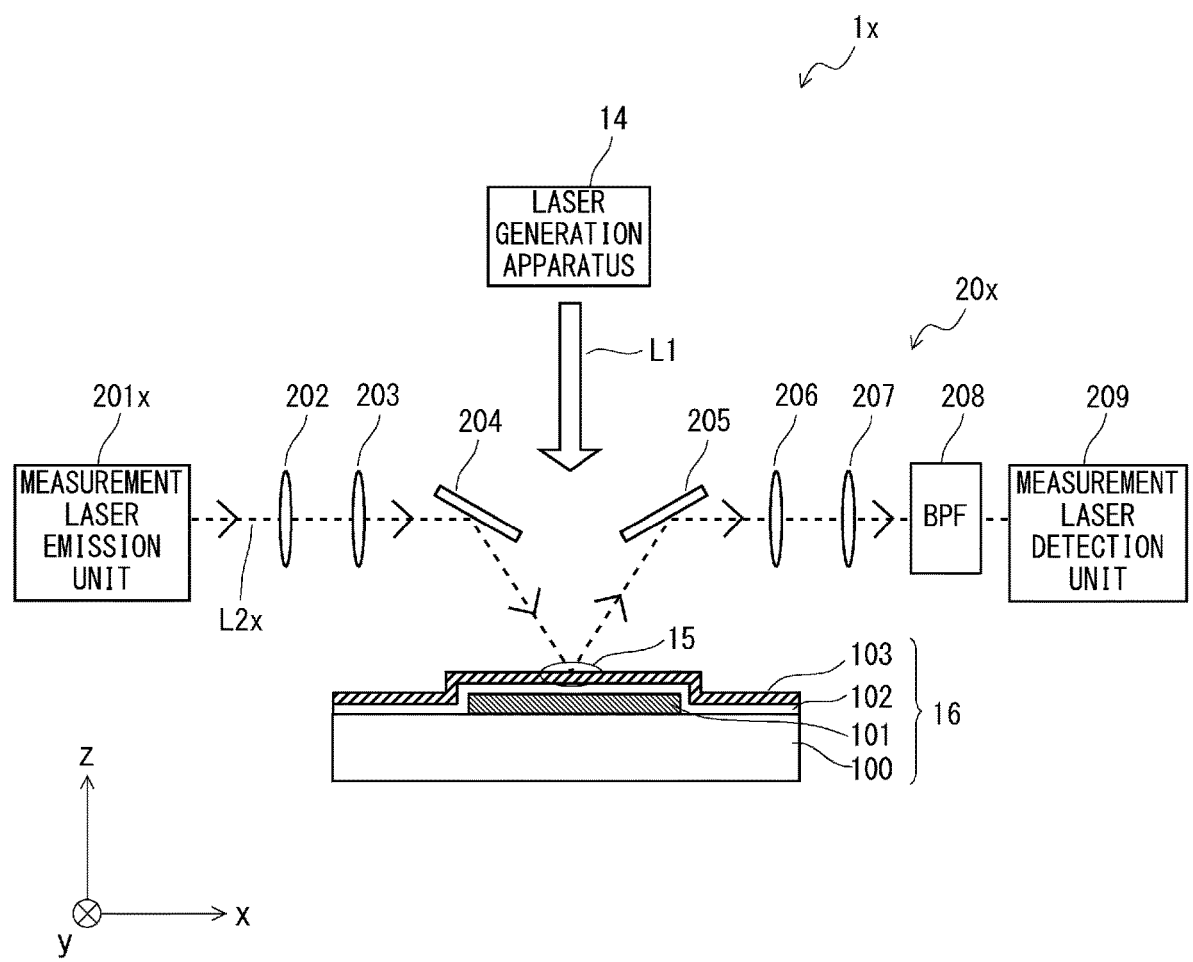
FIG. 4 shows an optical system of a measurement apparatus provided in a laser irradiation apparatus according to a concept that we had before conceiving a first embodiment.

FIG. 4 shows an optical system of a measurement apparatus 20x according to a concept that we had before conceiving this embodiment. Note that FIG. 4 also shows a laser generation apparatus 14 and an object to be processed 16. The object to be processed 16 is a substrate 100 having a bottom-gate structure in which a gate electrode 101 made of metal such as copper, a gate insulating film 102, and an amorphous silicon film 103 are laminated. Note that the gate electrode 101 is not limited to those made of copper (Cu), and may be made of one of tantalum (Ta), molybdenum (Mo), and aluminum (Al).

As shown in FIG. 4, the measurement apparatus 20x includes a measurement-laser emission unit 201x, a collimation lens 202, a condenser lens 203, a mirror 204, a mirror 205, a collimation lens 206, a condenser lens 207, a band-pass filter 208, and a measurement-laser detection unit 209.

The measurement-laser emission unit 201x emits laser light L2x having a wavelength different from that of the laser light L1 emitted from the laser generation apparatus 14. For example, while the laser generation apparatus 14 generates pulsed excimer laser light L1 having a center wavelength of 308 nm, the measurement-laser emission unit 201x emits pulsed HeNe laser light L2x having a center wavelength of 632.8 nm. Further, the laser light L2x is randomly-polarized light.

The laser light L2x emitted from the measurement-laser emission unit 201x is incident on the collimation lens 202. The collimation lens 202 converts the laser light L2x into a parallel luminous flux. The laser light L2x that has passed through the collimation lens 202 is incident on the condenser lens 203. The condenser lens 203 concentrates the laser light L2x coming from the collimation lens 202 at the laser irradiation place 15 on the object to be processed 16 through the mirror 204. The object to be processed 16 reflects the incident laser light L2x with a predetermined reflectance. The reflected light of the laser light L2x reflected by the object to be processed 16 is incident on the collimation lens 206 through the mirror 205. The collimation lens 206 converts the reflected light of the laser light L2x into a parallel luminous flux. The reflected light of the laser light L2x that has passed through the collimation lens 206 is incident on the condenser lens 207. The condenser lens 207 concentrates the reflected light of the laser light L2x that has passed through the collimation lens 206 onto the measurement-laser detection unit 209 through the band-pass filter 208. Note that the band-pass filter 208 removes unnecessary wavelength bands contained in the reflected light of the laser light L2x. The measurement-laser detection unit 209 detects the reflected light of the laser light L2x that has passed through the band-pass filter 208, and measures its reflectance by, for example, comparing the detected reflected light with the laser light L2x that has not yet been incident on the object to be processed 16. By doing so, the measurement-laser detection unit 209 observes a melting and solidification state of the amorphous silicon film 103 at the laser irradiation place 15.

However, when the metal gate electrode 101 is formed over the substrate 100 in addition to the amorphous silicon film 103 as in the case of the above-described example, the laser light L2x is reflected not only by the amorphous silicon film 103 but also by the gate electrode 101. Therefore, there is a possibility that the reflected light of the laser light L2x reflected by the amorphous silicon film 103 may be buried in (i.e., obscured by) the reflected light of the laser light L2x reflected by the gate electrode 101. Therefore, there is a possibility that the measurement-laser detection unit 209 cannot accurately detect a temporal change (i.e., a change over time) in the reflectance of the laser light L2x reflected by the amorphous silicon film 103 that occurs as the melting and solidification state of the amorphous silicon film 103 changes by the application of the laser light L1. As a result, there is a possibility that the laser irradiation apparatus cannot perform a high-quality annealing process for the amorphous silicon film 103.

Therefore, the inventors have achieved a measurement apparatus 20 according to a first embodiment capable of performing a high-quality annealing process for an amorphous film formed over an object to be processed.

Measurement Apparatus 20 According to First Embodiment

Figure 5:
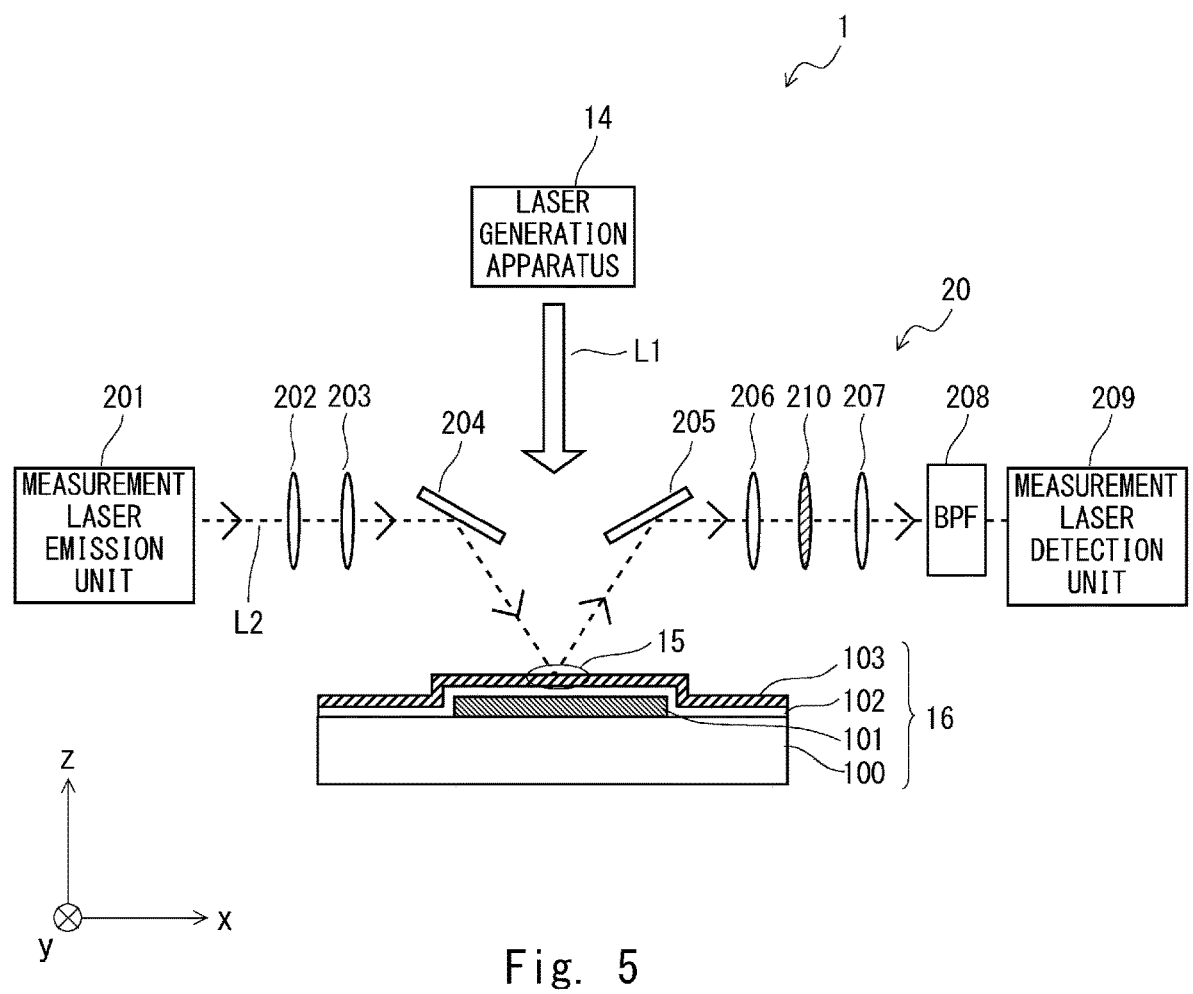
FIG. 5 shows an optical system of a measurement apparatus provided in a laser irradiation apparatus according to the first embodiment.

FIG. 5 shows an optical system of a measurement apparatus 20 according to a first embodiment. Note that FIG. 5 also shows a laser generation apparatus 14 and an object to be processed 16. The object to be processed 16 is a substrate 100 having a bottom-gate structure in which a gate electrode 101 made of metal such as copper, a gate insulating film 102, and an amorphous silicon film 103 are laminated.

As shown in FIG. 5, the measurement apparatus 20 includes a measurement-laser emission unit 201, a collimation lens 202, a condenser lens 203, a mirror 204, a mirror 205, a collimation lens 206, a condenser lens 207, a band-pass filter 208, a measurement-laser detection unit 209, and a polarizing plate (a first polarizing plate) 210.

The measurement-laser emission unit 201 emits laser light L2 having a wavelength different from that of the laser light L1 emitted from the laser generation apparatus 14. For example, while the laser generation apparatus 14 generates pulsed excimer laser light L1 having a center wavelength of 308 nm, the measurement-laser emission unit 201 emits pulsed HeNe laser light L2 having a center wavelength of 632.8 nm.

Note that the measurement-laser emission unit 201 emits linearly-polarized laser light L2 whose polarization direction is inclined by a predetermined angle. Specifically, the measurement-laser emission unit 201 emits linearly-polarized laser light L2 whose polarization direction is inclined by a predetermined angle $\varphi$ ($0°<\varphi<90°$) with respect to an incident plane which is a plane surface (a zx-plane) including the incident direction of the laser light L2 onto the object to be processed 16 and the reflecting direction of the laser light L2 by the object to be processed 16.

The laser light L2 emitted from the measurement-laser emission unit 201 is incident on the collimation lens 202. The collimation lens 202 converts the laser light L2 into a parallel luminous flux. The laser light L2 that has passed through the collimation lens 202 is incident on the condenser lens 203. The condenser lens 203 concentrates the laser light L2 coming from the collimation lens 202 at the laser irradiation place 15 on the object to be processed 16 through the mirror 204. The object to be processed 16 reflects the incident laser light L2 with a predetermined reflectance. The reflected light of the laser light L2 reflected by the object to be processed 16 is incident on the collimation lens 206 through the mirror 205. The collimation lens 206 converts the reflected light of the laser light L2 into a parallel luminous flux. The reflected light of the laser light L2 that has passed through the collimation lens 206 is incident on the polarizing plate 210.

The polarizing plate 210 lets, of the whole reflected light of the laser light L2 that has passed through the collimation lens 206, a part of the reflected light that has a predetermined polarization direction pass therethrough. Note that the polarizing plate 210 is positioned so that the polarization direction of the light that is made to pass therethrough is inclined with respect to the incident plane (the zx-plane) by a predetermined angle $-\varphi$.

The reflected light of the laser light L2 that has passed through the polarizing plate 210 is incident on the condenser lens 207. The condenser lens 207 concentrates the reflected light of the laser light L2 that has passed through the polarizing plate 210 at the measurement-laser detection unit 209 through the band-pass filter 208. Note that the band-pass filter 208 removes unnecessary wavelength bands contained in the reflected light of the laser light L2. The measurement-laser detection unit 209 detects the reflected light of the laser light L2 that has passed through the band-pass filter 208, and measures its reflectance by, for example, comparing the detected reflected light with the laser light L2 that has not yet been incident on the object to be processed 16. By doing so, the measurement-laser detection unit 209 observes a melting and solidification state of the amorphous silicon film 103 at the laser irradiation place 15.

Figure 6A:
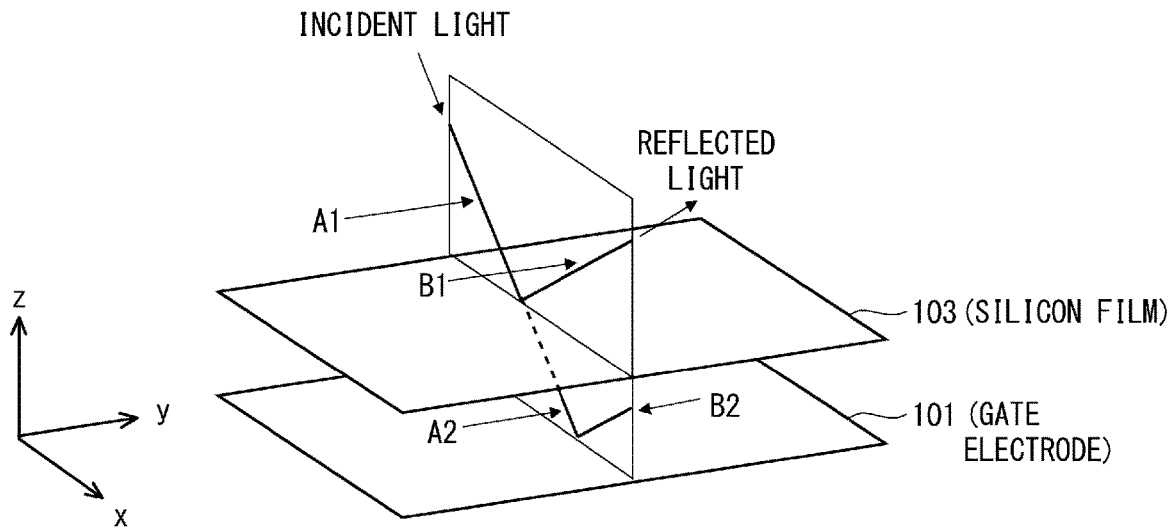
FIG. 6A is a diagram for explaining incidence of measurement laser light of the measurement apparatus shown in FIG. 5 on an object to be processed and reflection of the measurement laser light by the object to be processed.
Figure 6B:
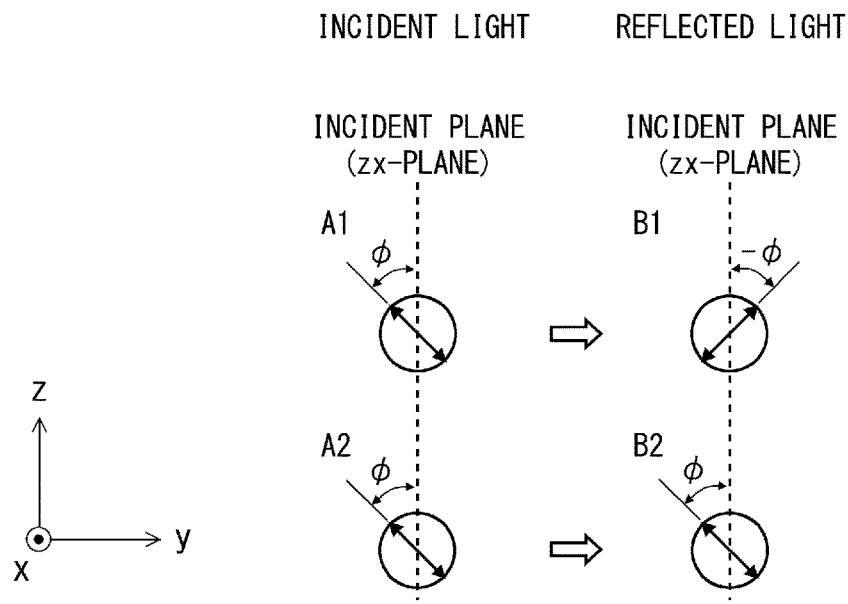
FIG. 6B is a diagram for explaining incidence of measurement laser light of the measurement apparatus shown in FIG. 5 on an object to be processed and reflection of the measurement laser light by the object to be processed.

Note that referring to FIGS. 6A and 6B, the polarization direction (the polarization direction on the yz-plane as viewed from the x-axis direction positive side) of the reflected light B1 of the laser light L2 reflected by the amorphous silicon film 103 is identical to one that is obtained by reversing the polarization direction (the polarization direction on the yz-plane as viewed from the x-axis direction positive side) of the incident light A1, which is the laser light L2 incident on the amorphous silicon film 103, with respect to the incident plane (the zx-plane). In other words, the polarization direction of the incident light A1 and the polarization direction of the reflected light B1 are plane-symmetric with respect to the incident plane (the zx-plane). Meanwhile, the polarization direction (the polarization direction on the yz-plane as viewed from the x-axis direction positive side) of the reflected light B2 of the laser light L2 reflected by the metal gate electrode 101 substantially coincides with the polarization direction (the polarization direction on the yz-plane as viewed from the x-axis direction positive side) of the incident light A2, which is the laser light L2 incident on the gate electrode 101. That is, the polarization direction of the reflected light of the laser light L2 reflected by the amorphous silicon film 103 differs from that of the reflected light of the laser light L2 reflected by the gate electrode 101.

Therefore, the polarizing plate 210 is positioned so that the polarization direction of the light that is made to pass therethrough becomes as parallel as possible to the polarization direction of the reflected light B1 of the laser light L2 reflected by the amorphous silicon film 103. In this way, the polarizing plate 210 can let the reflected light B1 of the laser light L2 reflected by the amorphous silicon film 103 pass therethrough, while blocking the reflected light B2 of the laser light L2 reflected by the gate electrode 101. Consequently, the measurement-laser detection unit 209 can accurately detect a temporal change (i.e., a change over time) in the reflectance of the laser light L2 reflected by the amorphous silicon film 103 that occurs as the melting and solidification state of the amorphous silicon film 103 changes by the application of the laser light L1. As a result, the laser irradiation apparatus 1 can perform a high-quality annealing process for the amorphous silicon film 103. Therefore, it is possible to, for example, form a homogeneous crystal film.

Figure 7:
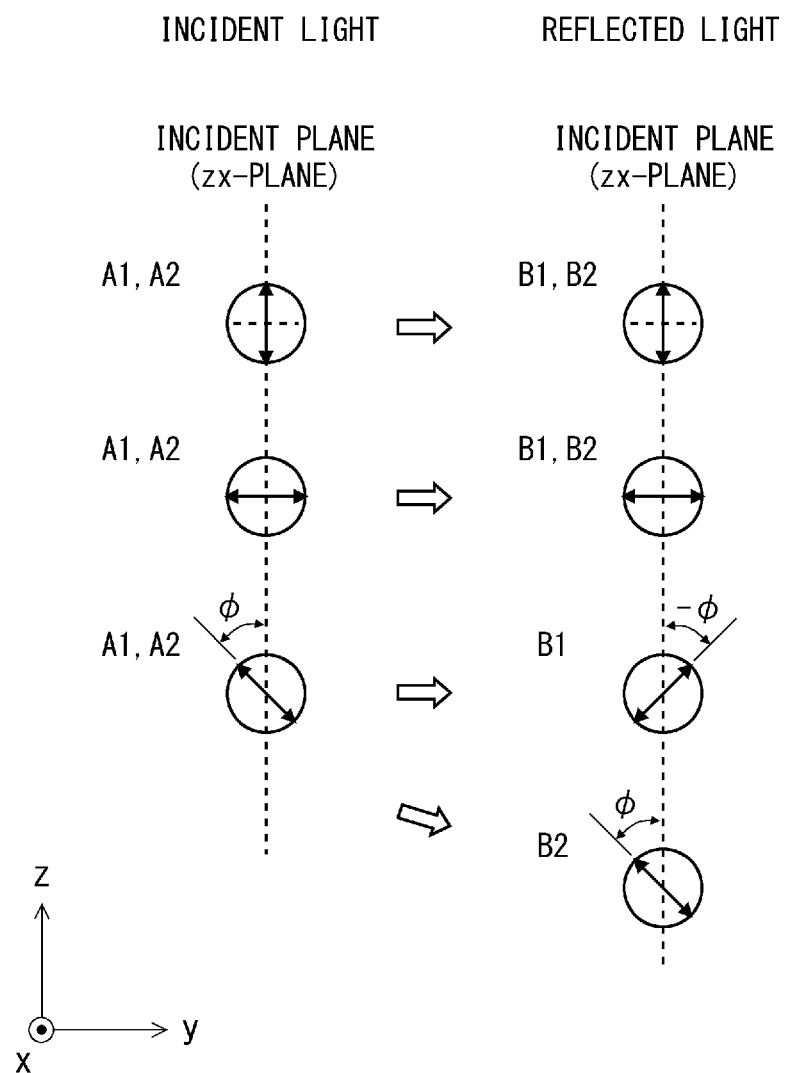
FIG. 7 is a diagram for explaining incidence of measurement laser light of the measurement apparatus shown in FIG. 5 on an object to be processed and reflection of the measurement laser light by the object to be processed.

Note that as shown in FIG. 7, when the polarization directions of the incident lights A1 and A2 are parallel to the incident plane (the zx-plane), both of the polarization directions of the reflected lights B1 and B2 remain parallel to the incident plane. Further, when the polarization directions of the incident lights A1 and A2 are perpendicular to the incident plane, both of the polarization directions of the reflected lights B1 and B2 remain perpendicular to the incident plane. In these cases, the polarizing plate 210 cannot let the reflected light B1 of the laser light L2 reflected by the amorphous silicon film 103 pass therethrough and block the reflected light B2 of the laser light L2 reflected by the gate electrode 101 at the same time.

In contrast, when the polarization directions of the incident lights A1 and A2 are inclined with respect to the incident plane (the zx-plane) by an angle $\varphi$ larger than 0 degrees and smaller than 90 degrees (preferably by 45 degrees), the polarization direction of the reflected light B1 reflected by the amorphous silicon film 103 becomes one that is obtained by reversing the polarization direction of the incident light A1 with respect to the incident plane, and the polarization direction of the reflected light B2 reflected by the gate electrode 101 coincides with the polarization direction of the incident light A2. In this case, by positioning the polarizing plate 210 so that the polarization direction of the light that is made to pass therethrough becomes as parallel as possible to the polarization direction of the reflected light B1, it is possible to let the reflected light B1 of the laser light L2 reflected by the amorphous silicon film 103 pass through the polarizing plate 210 and block the reflected light B2 of the laser light L2 reflected by the gate electrode 101 by the polarizing plate 210 at the same time.

As described above, in the laser irradiation apparatus (1) according to this embodiment, the measurement apparatus 20 includes: the measurement-laser emission unit 201 that applies linearly-polarized laser light L2 to an irradiation area on an object to be processed 16 to which laser light L1 is applied; a polarizing plate 210 that lets, of the whole reflected light of the laser light L2 reflected by the object to be processed 16, a part of the reflected light of the laser light L2 that has a predetermined polarization direction pass therethrough; and a measurement-laser detection unit 209 that detects the reflected light that has passed through the polarizing plate 210. In this way, the laser irradiation apparatus 1 according to this embodiment can accurately detect, even when a metal gate electrode is formed over the substrate, which is the object to be processed 16, in addition to a silicon film, the reflected light of the laser light L2 reflected by the silicon film. Therefore, the laser irradiation apparatus 1 can perform a high-quality annealing process for the silicon film.

Modified Example of Measurement Apparatus 20

Next, a laser irradiation apparatus 1a, which is a modified example of the laser irradiation apparatus 1, will be described. As compared with the laser irradiation apparatus 1, the laser irradiation apparatus 1a includes a measurement apparatus 20a in place of the measurement apparatus 20. The laser irradiation apparatus 1a will be described in detail.

Figure 8:
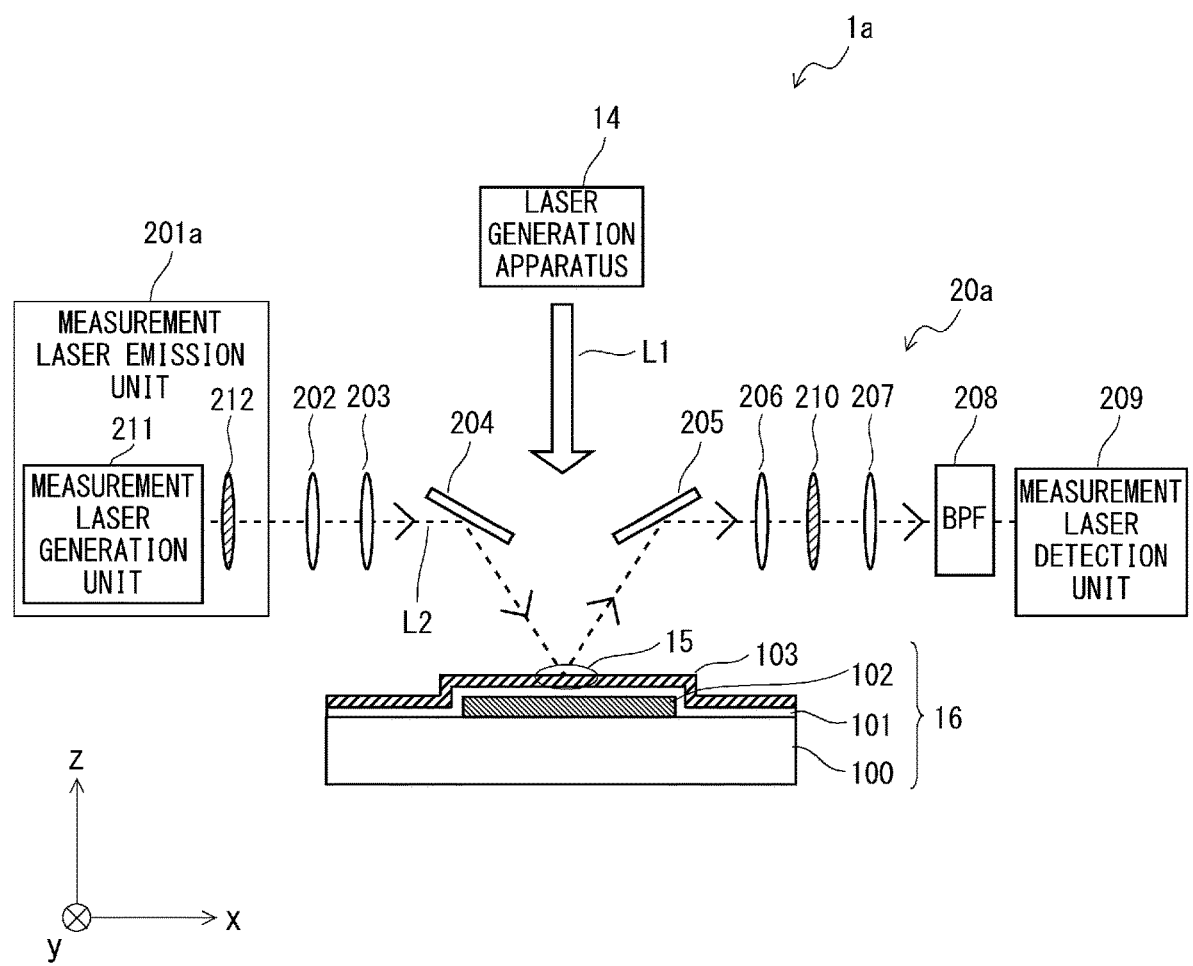
FIG. 8 shows an optical system of a modified example of the measurement apparatus provided in the laser irradiation apparatus according to the first embodiment.

FIG. 8 shows an optical system of the measurement apparatus 20a, which is a modified example of the measurement apparatus 20. As compared with the measurement apparatus 20, the measurement apparatus 20a includes a measurement-laser emission unit 201a in place of the measurement-laser emission unit 201. The measurement-laser emission unit 201a includes a measurement-laser generation unit 211 and a polarizing plate (a second polarizing place) 212.

In the measurement-laser emission unit 201a, the measurement-laser generation unit 211 generates randomly-polarized reference laser light L0. Then, the polarizing plate 212 lets, of the whole laser light L0 generated by the measurement-laser generation unit 211, a part of the laser light L0 that has a predetermined polarization direction pass therethrough as the laser light L2. Note that the polarizing plate 212 is positioned so that the polarization direction of the light that is made to pass therethrough is inclined with respect to the incident plane (the zx-plane) by a predetermined angle φ.

The rest of the configuration of the measurement apparatus 20a is similar to that of the measurement apparatus 20, and therefore its description is omitted.

The measurement apparatus 20a can implement functions equivalent to those of the measurement apparatus 20. Note that the polarizing plate 212 may be configured to be rotatable. In this way, the measurement apparatus 20a can finely adjust the polarization direction of the reflected light B1 so that the reflected light B1 of the laser light L2 reflected by the amorphous silicon film 103 can easily pass through the polarizing plate 210. Needless to say, the polarizing plate 210 may be configured to be rotatable in each of the measurement apparatuses 20 and 20a.

Organic E1 Display

A semiconductor device including the above-described substrate in which a polysilicon film is formed is suitable for a TFT (Thin Film Transistor) array substrate for an organic EL (Electro Luminescence) display. That is, the polysilicon film is used as a semiconductor layer including a source region, a channel region, and a drain region of a TFT.

Figure 9:
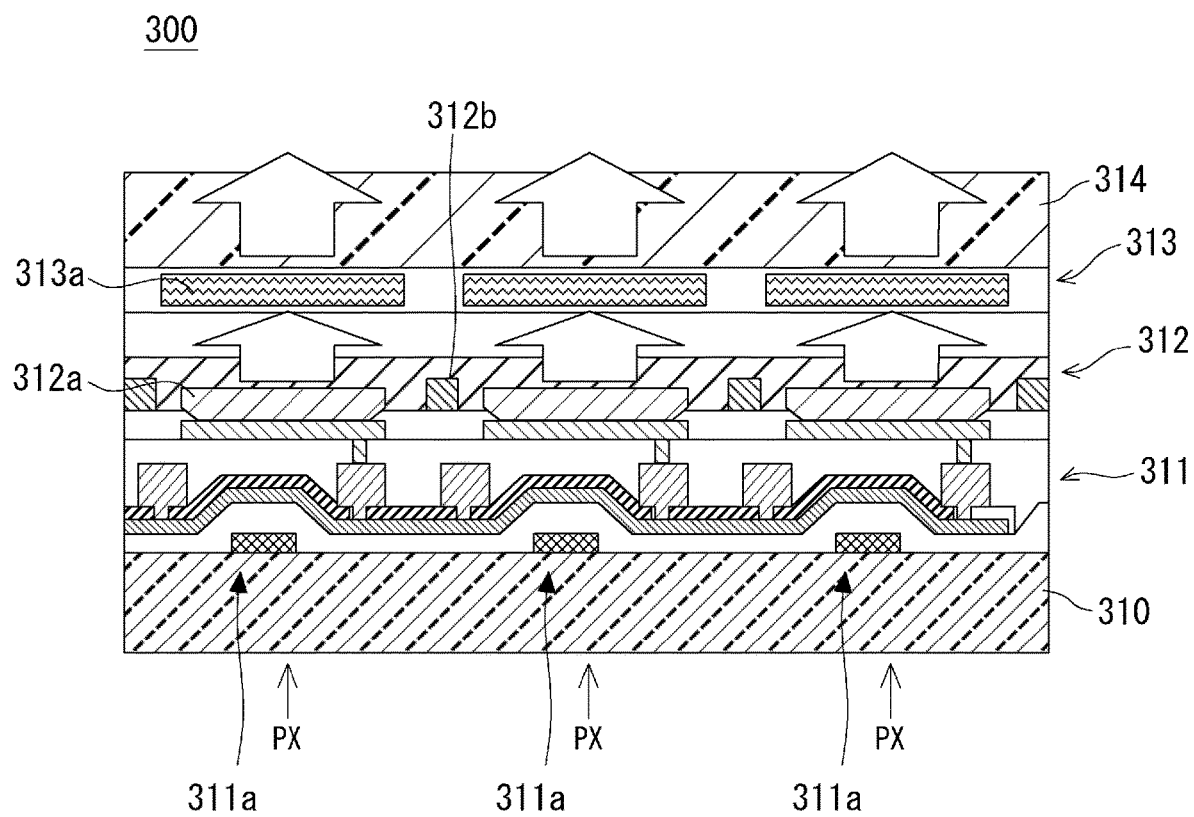
FIG. 9 is a cross-sectional view showing a configuration of an organic EL (Electro Luminescence) display in a simplified manner.

A configuration in which a semiconductor device according to this embodiment is applied to an organic EL display will be described hereinafter. FIG. 9 is a cross-sectional view showing a pixel circuit of an organic EL display in a simplified manner. An organic EL display device 300 shown in FIG. 9 is an active-matrix-type display device in which a TFT is disposed in each pixel PX.

The organic EL display device 300 includes a substrate 310, a TFT layer 311, an organic layer 312, a color filter layer 313, and a sealing substrate 314. The TFT layer 311 is provided over the substrate 310. The TFT layer 311 includes TFTs 311a disposed in the respective pixels PX. Further, the TFT layer 311 includes wiring lines (not shown) connected to the TFTs 311a, and the like. The TFTs 311a, the wirings, and the like constitute pixel circuits.

The organic layer 312 is provided over the TFT layer 311. The organic layer 312 includes an organic EL light-emitting element 312a disposed in each pixel PX. In the organic layer 312, separation walls 312b for separating organic EL light-emitting elements 312a are provided between pixels PX. The color filter layer 313 is provided over the organic layer 312. The color filter layer 313 includes color filters 313a for performing color displaying. When white light emitted from the organic layer 312 passes through the color filters 313a, the white light is converted into light having RGB colors. A sealing substrate 314 is provided over the color filter layer 313 in order to prevent the organic EL light-emitting elements of the organic layer 312 from deteriorating.

Electric currents flowing through the organic EL light-emitting elements 312a of the organic layer 312 are changed by display signals supplied to the pixel circuits. Therefore, it is possible to control an amount of light emitted in each pixel PX by supplying a display signal corresponding to a display image to each pixel PX. As a result, it is possible to display a desired image.

Note that although the organic EL display device has been described above as an example of a device using a semiconductor device including TFTs, the semiconductor device including TFTs may be other types of display devices such as a liquid crystal display device.

Method for Manufacturing Semiconductor Device

A method for manufacturing a semiconductor device using the laser irradiation apparatus 1 (1a) according to this embodiment is suitable for the manufacturing of a TFT array substrate. A method for manufacturing a semiconductor device including TFTs will be described with reference to FIGS. 9 to 17. FIGS. 10 to 17 are cross-sectional views showing steps of a method for manufacturing a semiconductor device. In the following description, a method for manufacturing a semiconductor device including inverted-staggered-type TFTs, i.e., TFTs having a bottom-gate structure will be described.

Figure 10:
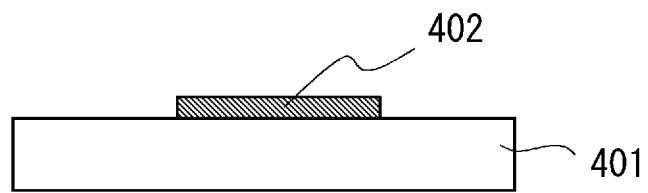
FIG. 10 is a cross-sectional view showing a process in a method for manufacturing a semiconductor device according to the embodiment.

Firstly, as shown in FIG. 10, a gate electrode 402 is formed over a glass substrate 401. Note that the glass substrate 401 corresponds to the above-described substrate 100. For the gate electrode 402, for example, a thin metal film containing copper, aluminum or the like may be used. A thin metal film is formed over the glass substrate 401 by a sputtering method or a vapor deposition method. Then, the gate electrode 402 is formed by patterning the thin metal film by photolithography. Note that the gate electrode 402 corresponds to the above-described gate electrode 101. In the photolithography method, various processes such as applying a resist, exposure, development, etching, and removing the resist are performed. Note that various types of wiring lines and the like may be formed through the same steps as those for the patterning of the gate electrode 402.

Figure 11:
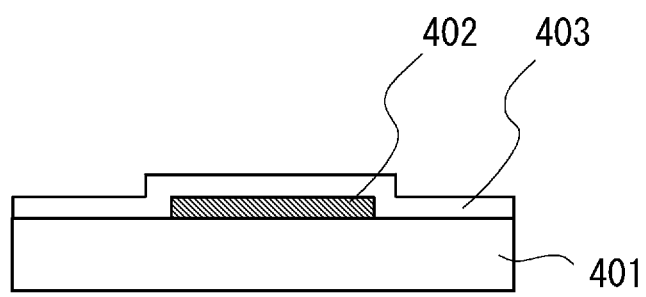
FIG. 11 is a cross-sectional view showing a process in a method for manufacturing a semiconductor device according to the embodiment.
Figure 12:
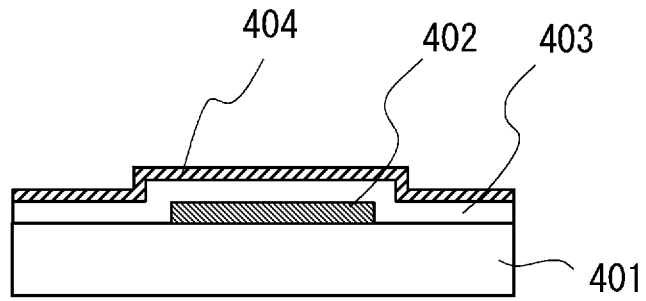
FIG. 12 is a cross-sectional view showing a process in a method for manufacturing a semiconductor device according to the embodiment.

Next, as shown in FIG. 11, a gate insulating film 403 is formed over the gate electrode 402. Note that the gate insulating film 403 corresponds to the above-described gate insulating film 102. The gate insulating film 403 is formed so as to cover the gate electrode 402. Then, as shown in FIG. 12, an amorphous silicon film 404 is formed over the gate insulating film 403. The amorphous silicon film 404 is disposed so as to be placed over the gate electrode 402 with the gate insulating film 403 interposed therebetween. Note the amorphous silicon film 404 corresponds to the above-described amorphous silicon film 103.

The gate insulating film 403 is, for example, a silicon nitride film (an $SiN_x$ film), a silicon oxide film (an $SiO_2$ film), or a laminated film thereof. Specifically, the gate insulating film 403 and the amorphous silicon film 404 are successively formed by a CVD (Chemical Vapor Deposition) method.

Figure 13:
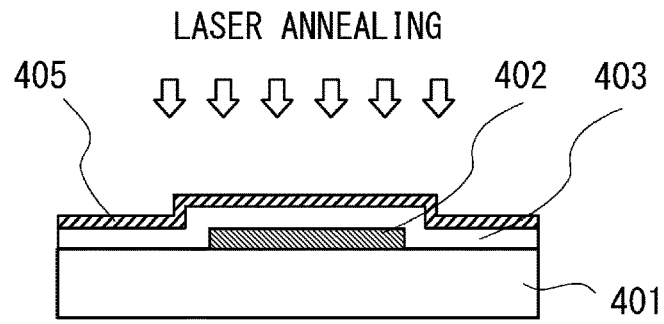
FIG. 13 is a cross-sectional view showing a process in a method for manufacturing a semiconductor device according to the embodiment.

Then, the amorphous silicon film 404 is irradiated with laser light L1, so that a polysilicon film 405 is formed as shown in FIG. 13. That is, the amorphous silicon film 404 is crystallized by the laser irradiation apparatus 1 shown in FIG. 5 and the like. In this way, the polysilicon film 405 in which silicon is crystallized is formed over the gate insulating film 403.

Note that although it is not shown in the drawings, the polysilicon film 405 is patterned by a photolithography method. Further, impurities may be implanted into the polysilicon film 405 by an ion implantation method or the like.

Figure 14:
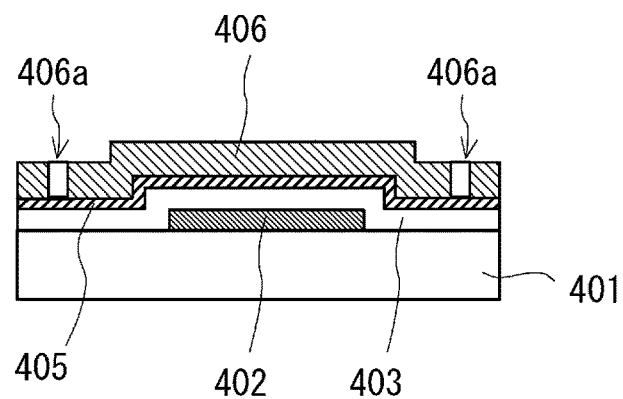
FIG. 14 is a cross-sectional view showing a process in a method for manufacturing a semiconductor device according to the embodiment.

After that, as shown in FIG. 14, an interlayer insulating film 406 is formed over the polysilicon film 405. Contact holes 406a for exposing the polysilicon film 405 are formed through the interlayer insulating film 406.

The interlayer insulating film 406 is a silicon nitride film (an $SiN_x$ film), a silicon oxide film (an $SiO_2$ film), a laminated film thereof, or the like. Specifically, the interlayer insulating film 406 is formed by a CVD method. Then, the interlayer insulating film 406 is patterned by a photolithography method, so that contact holes 406a are formed.

Figure 15:
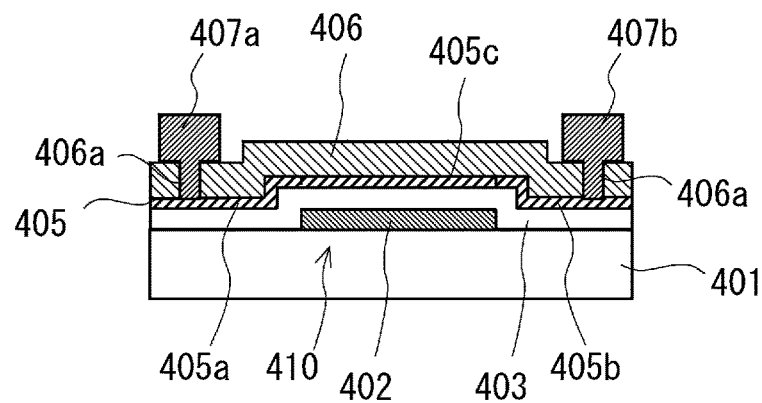
FIG. 15 is a cross-sectional view showing a process in a method for manufacturing a semiconductor device according to the embodiment.

Next, as shown in FIG. 15, a source electrode 407a and a drain electrode 407b are formed over the interlayer insulating film 406. The source electrode 407a and the drain electrode 407b are formed so as to cover the contact holes 406a. That is, the source electrode 407a and the drain electrode 407b are formed from the inside of the contact holes 406a to above the interlayer insulating film 406. Therefore, the source electrode 407a and the drain electrode 407b are electrically connected to the polysilicon film 405 through the contact holes 406a.

In this way, a TFT(s) 410 is formed. The TFT 410 corresponds to the above-described TFT 311a. A region in the polysilicon film 405 located directly above the gate electrode 402 becomes a channel region 405c. In the polysilicon film 405, the region on the source electrode 407a side with respect to the channel region 405c becomes a source region 405a, and the region on the drain electrode 407b side becomes a drain region 405b.

The source electrode 407a and the drain electrode 407b are formed of, for example, a thin metal film containing copper, aluminum or the like. The thin metal film is formed over the interlayer insulating film 406 by a sputtering method or a vapor deposition method. Then, the thin metal film is patterned by photolithography, so that a source electrode 407a and a drain electrode 407b are formed. Note that various types of wiring lines may be formed through the same steps as those for the patterning of the source electrode 407a and the drain electrode 407b.

Figure 16:
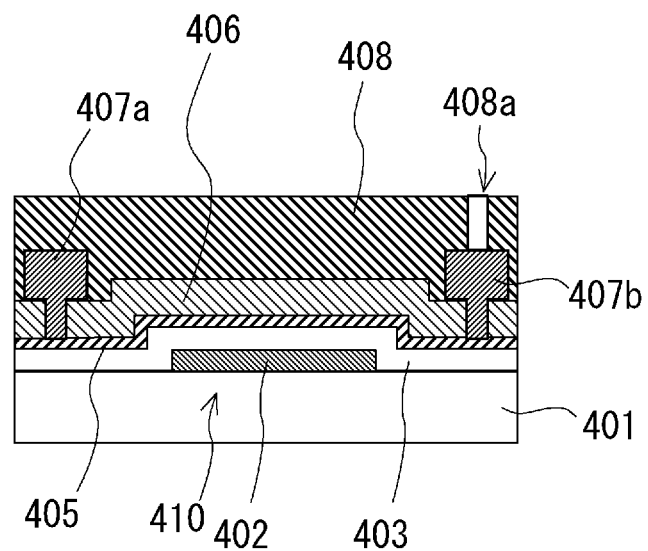
FIG. 16 is a cross-sectional view showing a process in a method for manufacturing a semiconductor device according to the embodiment.

Then, as shown in FIG. 16, a flattening film 408 is formed over the source electrode 407a and the drain electrode 407b. The flattening film 408 is formed so as to cover the source electrode 407a and the drain electrode 407b. Further, contact holes 408a for exposing the drain electrode 407b are formed through the flattening film 408.

The flattening film 408 is formed of, for example, a photosensitive resin film. A photosensitive resin film is applied over the source electrode 407a and the drain electrode 407b. Then, the applied photosensitive resin film is exposed to light and developed. In this way, the flattening film 408 with the contact holes 408a formed therein can be patterned.

Figure 17:
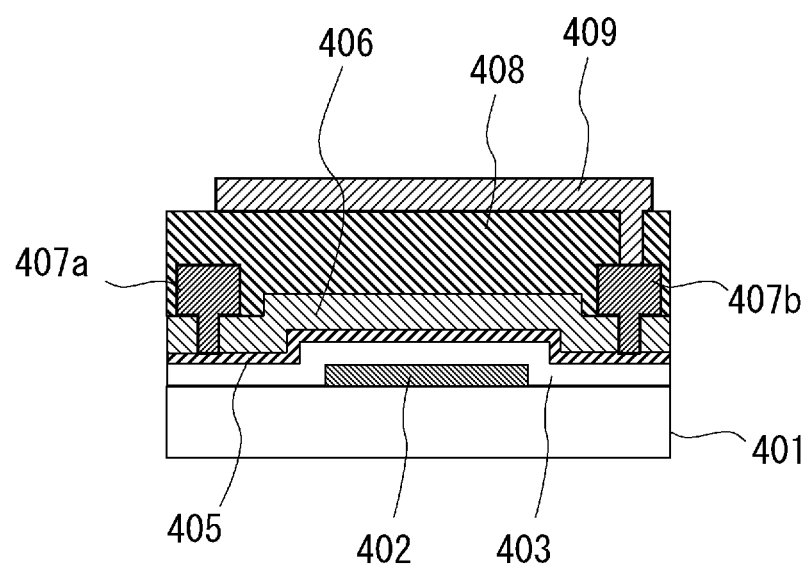
FIG. 17 is a cross-sectional view showing a process in a method for manufacturing a semiconductor device according to the embodiment.

Then, as shown in FIG. 17, a pixel electrode 409 is formed over the flattening film 408. The pixel electrode 409 is formed so as to cover the contact holes 408a. That is, the pixel electrode 409 is formed from the inside of the contact holes 408a to above the flattening film 408. Therefore, the pixel electrode 409 is electrically connected to the drain electrode 407b through the contact holes 408a.

The pixel electrode 409 is formed of a transparent conductive film or a thin metal film containing aluminum or the like. A conductive film (a transparent conductive film or a thin metal film) is formed over the flattening film 408 by a sputtering method or the like. Then, the conductive film is patterned by a photolithography method. In this way, a pixel electrode 409 is formed over the flattening film 408. In the case of TFTs for driving an organic EL display, an organic EL light-emitting element 312a, a color filter (CF) 313a and the like, such as those shown in FIG. 9, are formed over the pixel electrode 409. Note that in the case of a top-emission-type organic EL display, the pixel electrode 409 is formed of a thin metal film having a high reflectance such as a thin metal film containing aluminum or silver. Further, in the case of a bottom-emission-type organic EL display, the pixel electrode 409 is formed of a transparent conductive film such as ITO.

The manufacturing process for inverted-staggered-type TFTs has been described above, and the manufacturing method according to this embodiment can be suitably applied to the manufacture of inverted-staggered-type TFTs. Needless to say, the method for manufacturing TFTs is not limited to the manufacturing of TFTs for an organic EL display, and can also be applied to the manufacturing of TFTs for an LCD (Liquid Crystal Display).

Further, the above description is given on the assumption that the laser annealing apparatus according to this embodiment forms a polysilicon film by irradiating an amorphous silicon film with laser light. However, the laser annealing apparatus may be one that forms a microcrystalline silicon film by irradiating an amorphous silicon film with laser light. Further, the laser light used for the annealing is not limited to the excimer laser. Further, the method according to this embodiment can also be applied to a laser annealing apparatus that crystallizes a thin film other than the silicon film. That is, the method according to this embodiment can be applied to any type of laser annealing apparatuses that form a crystallized film by irradiating an amorphous film with laser light. According to the laser annealing apparatus in accordance with this embodiment, a substrate with a crystallized film can be appropriately inspected.

Note that the present disclosure is not limited to the above-described embodiments and various modifications can be made without departing from the spirit and scope of the present disclosure.

The present disclosure made by the inventors of the present application has been explained above in a concrete manner based on embodiments. However, the present disclosure is not limited to the above-described embodiments, and needless to say, various modifications can be made without departing from the spirit and scope of the present disclosure.

From the disclosure thus described, it will be obvious that the embodiments of the disclosure may be varied in many ways. Such variations are not to be regarded as a departure from the spirit and scope of the disclosure, and all such modified examples as would be obvious to one skilled in the art are intended for inclusion within the scope of the following claims.

What is claimed is:

1. A laser irradiation apparatus comprising:
   a laser generation apparatus configured to generate first laser light for performing heat treatment of an object to be processed;
   a measurement-laser emission unit configured to emit linearly-polarized second laser light toward an irradiation area on the object to be processed to which the first laser light is applied;
   a first polarizing plate configured to let, of the whole reflected light of the linearly-polarized second laser light reflected by the object to be processed, a part of the reflected light that has a first polarization direction pass therethrough; and
   a measurement-laser detection unit configured to detect the reflected light that has passed through the first polarizing plate, wherein
   the first polarizing plate is positioned so that the first polarization direction is inclined with respect to an incident plane by about 45 degrees, the incident plane being a plane surface including an incident direction of the linearly-polarized second laser light onto the object to be processed and a reflecting direction of the linearly-polarized second laser light by the object to be processed, and
   the measurement-laser emission unit is configured to emit the linearly-polarized second laser light in a second polarization direction corresponding to the first polarization direction.

2. The laser irradiation apparatus according to claim 1, wherein the measurement-laser emission unit comprises:
   a measurement-laser generation unit configured to generate randomly-polarized reference laser light; and
   a second polarizing plate configured to let, of the randomly-polarized reference laser light generated by the measurement-laser generation unit, a part of the reference laser light having a second polarization direction corresponding to the first polarization direction pass therethrough as the linearly-polarized second laser light.

3. The laser irradiation apparatus according to claim 2, wherein the second polarizing plate is configured to be rotatable.

4. The laser irradiation apparatus according to claim 1, wherein the second polarization direction is inclined with respect to the incident plane by a predetermined angle.

5. The laser irradiation apparatus according to claim 4, wherein the second polarization direction and the first polarization direction are symmetric with respect to the incident plane.

6. The laser irradiation apparatus according to claim 1, wherein the object to be processed is a substrate having a bottom-gate structure in which a metal electrode and an amorphous film are laminated.

7. The laser irradiation apparatus according to claim 1, wherein
   the object to be processed is a substrate in which an amorphous semiconductor film is formed, and
   the amorphous semiconductor film is transformed into a polycrystalline semiconductor film by irradiating it with the first laser light.

* * * * *